United States Patent [19]
Ramet

[11] Patent Number: 5,483,196
[45] Date of Patent: Jan. 9, 1996

[54] AMPLIFIER ARCHITECTURE AND APPLICATION THEREOF TO A BAND-GAP VOLTAGE GENERATOR

[75] Inventor: Serge Ramet, Grenoble, France

[73] Assignee: SGS-Thomson Microelectronics S.A., Pouilly, France

[21] Appl. No.: 225,374

[22] Filed: Apr. 8, 1994

[30] Foreign Application Priority Data

Apr. 9, 1993 [FR] France .................................. 93 04547

[51] Int. Cl.$^6$ ........................................................ H03F 3/45
[52] U.S. Cl. ............................................ 330/257; 323/313
[58] Field of Search ........................................ 323/313, 314, 323/315, 316; 330/253, 257, 260, 261

[56] References Cited

U.S. PATENT DOCUMENTS

| | | | |
|---|---|---|---|
| 4,029,974 | 6/1977 | Brokaw | 307/296 R |
| 4,450,367 | 5/1984 | Whatley | 307/297 |
| 4,524,318 | 6/1985 | Burnham et al. | 323/313 |
| 5,087,830 | 2/1992 | Cave et al. | 323/314 X |
| 5,124,666 | 6/1992 | Liu et al. | 330/257 X |
| 5,126,653 | 6/1992 | Ganesan et al. | 323/313 |

OTHER PUBLICATIONS

IEEE Journal of Solid-State Circuits, vol. 24, No. 3, Jun. 1989, New York, U.S., pp. 690–697, M. Ferro, et al., "A Floating CMOS Bandgap Voltage Reference For Differential Applications".

Patent Abstracts of Japan, vol. 10, No. 154 (P-463)(2210) Jun. 4, 1986 & JP-A-61 006 717.

*Primary Examiner*—Steven Mottola
*Attorney, Agent, or Firm*—Wolf, Greenfield & Sacks

[57] ABSTRACT

An amplifier includes in series, between high and low supply voltages, first, second, and third transistors. The first transistor is an input transistor of a first current mirror, and the second transistor is an output transistor of a second current mirror. The control electrode of the third transistor forms an inverting input of the amplifier. The amplifier further includes, in series between the high and low supply voltages, fourth, fifth, and sixth transistors. The fourth transistor is an output transistor of the first current mirror, and the fifth transistor is an input transistor of the second current mirror. The control electrode of the sixth transistor forms a non-inverting input of the amplifier. The output current of the amplifier is provided by a seventh transistor. The amplifier is applied to form a band-gap voltage generator having a small number of circuit branches.

35 Claims, 2 Drawing Sheets

AMPLIFIER ARCHITECTURE AND APPLICATION THEREOF TO A BAND-GAP VOLTAGE GENERATOR

BACKGROUND OF THE INVENTION

1. Field of the Invention

The present invention relates to a differential amplifier and to the application thereof to a band-gap voltage generator.

The band-gap voltage (approximately 1.2 volts) is a temperature-independent voltage that is used as a reference voltage in applications requiring high temperature stability.

2. Discussion of the Related Art

FIG. 1 schematically represents a conventional band-gap voltage generator such as described, for example, in "Analysis and Design of Analog Integrated Circuits" by P. R. Gray and R. G. Meyer; John Wiley & Sons.

An operational amplifier 10 amplifies the voltage difference between a node A and a node B and applies the amplified voltage at a node C. Node A is connected to a low voltage Vss successively through a resistor R1 and a diode-connected PNP bipolar transistor Q1, and is connected to node C through a resistor R2. Node B is connected to node C through a resistor R3, and to the low voltage Vss through a diode-connected PNP transistor Q2. The emitter surface of transistor Q1 is larger than the emitter surface of transistor Q2.

The operational amplifier 10, supplied between a high voltage Vdd and the low voltage Vss, acts on node C to keep the voltages of nodes A and B equal. Thus, the voltage across resistor R1 is equal to the difference between the base-emitter voltages of transistors Q1 and Q2. This difference is proportional to the absolute temperature and to the natural logarithm of the ratio of the emitter surface of transistor Q1 to the emitter surface of transistor Q2. This voltage difference, which has a positive temperature coefficient, induces a current that flows across resistor R2 (between nodes C and A), and generates a voltage whose value depends on the ratio R2/R1. Feedback from the operational amplifier 10 forces the voltage between node A and the low voltage Vss to equal the base-emitter voltage of transistor Q2, which has a negative temperature coefficient. By suitably choosing ratio R2/R1, the temperature coefficient of the resulting voltage between node C and Vss is cancelled. In this case, the band-gap voltage is obtained between node C and Vss. The value of resistor R3 is selected to equal the value of resistor R2.

In bipolar technology, there are very simple solutions for implementing such generators, more particularly, for implementing the operational amplifier 10.

In CMOS technology, an operational amplifier satisfying the function of the operational amplifier 10 of FIG. 1 includes a predetermined number of branches, that is, current paths between the high voltage Vdd and the low voltage Vss, which must be biased by a current generator. The simplest solution for biasing the branches consists of providing a biasing generator 12 that feeds a multi-output current mirror, each output serving to bias a branch.

A circuit such as the one of FIG. 1, more particularly the biasing generator 72, has a stable zero-current operating point. Thus, if no current starts flowing through the circuit upon powering-on, amplifier 10, and therefore the voltage generator, fails to start operating. To avoid this drawback, a starting circuit 14 is provided to detect zero current in one branch and to inject a current into the circuit to make the circuit switch to a non-zero current operating point.

A drawback of the CMOS circuits such as the one of FIG. 1 is that a large number of branches are necessary in conventional implementations of operational amplifiers 10. The need for a large number of branches involves both a complex circuit and a particularly high power consumption because, generally, the current in the different branches is of the same order of magnitude.

SUMMARY OF THE INVENTION

An object of the invention is to provide an operational amplifier having a particularly small number of branches.

Another object of the invention is to provide a CMOS band-gap voltage generator having a particularly small number of branches.

These objects are achieved with a differential amplifier including in series, between first and second supply voltages, first, second, and third transistors of a first type, of a second type, and of the first type, respectively. The first transistor is an input transistor of a first current mirror, the second transistor is an output transistor of a second current mirror, the control electrode of the third transistor forming an inverting input of the amplifier. The amplifier also includes, in series between the first and second supply voltages, fourth, fifth, and sixth transistors of the first, second, and first type, respectively. The fourth transistor is an output transistor of the first current mirror, the fifth transistor is an input transistor of the second current mirror, the control electrode of the sixth transistor forming a non-inverting input of the amplifier. The amplifier output current is provided by a seventh transistor of the first type that is an output transistor of the first current mirror.

A band-gap voltage generator according to the invention includes the above-mentioned amplifier. The amplifier supplies first and second bipolar transistors of dissimilar sizes connected to the second supply voltage. The first and second bipolar transistors are connected to the amplifier output through a pair of resistors and through a single resistor, respectively, the connection point between the resistors of the pair of resistors being connected to the amplifier inverting input, and the connection point between the single resistor and the second bipolar transistor being connected to the amplifier non-inverting input.

According to an embodiment of the invention, the third and sixth transistors of the amplifier are respectively connected to the bases of the first and second bipolar transistors and to the second supply voltage through, respectively, a third and a fourth diode-connected bipolar transistor.

According to an embodiment of the invention, the generator includes means for providing a current to the second current mirror if the first current mirror does not provide current.

The foregoing and other objects, features, aspects and advantages of the invention will become apparent from the following detailed description of the present invention when taken in conjunction with the accompanying drawings.

DETAILED DESCRIPTION

Figure 2:
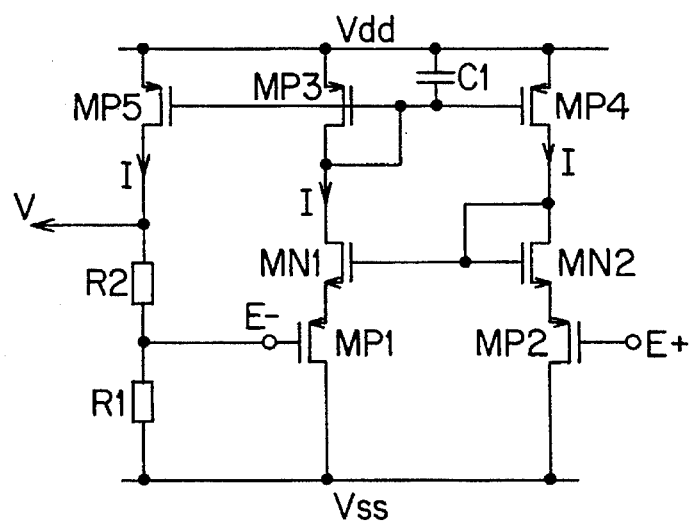
FIG. 2 represents an embodiment of a CMOS amplifier according to the invention.

FIG. 2 represents a pair of P-channel MOS transistors MP1 and MP2 whose gates constitute an inverting input E– and a non-inverting input E+, respectively, of an amplifier according to the invention. The drains of transistors MP1 and MN2 are connected to a low voltage Vss, and the sources of transistors MP1 and MP2 are respectively connected to the sources of N-channel MOS transistors MN1 and MN2. The drains of transistors MN1 and MN2 are connected to the drains of the P-channel MOS transistors MP3 and MP4, respectively, which in turn are connected to a high voltage Vdd through their sources. The drain of transistor MN2 is connected to the gates of transistors MN1 and MN2; the drain of transistor MP3 is connected to the gates of transistors MP4 and MP3. A P-channel MOS transistor MP5 is connected with its source and gate in parallel with the sources and gates, respectively, of transistors MP3 and MP4. The output V of the amplifier is drawn from the drain of transistor MP5.

With this configuration, transistors MP3 and MP4, on the one hand, and transistors MN1 and MN2, on the other hand, respectively constitute two head-to-tail-connected current mirrors. The drain current I of the input transistor, MP3, of the first current mirror is duplicated on the drain of the output transistor MP4 of the first current mirror. Similarly, the drain current I of the input transistor, MN2, of the second current mirror is duplicated on the drain of the output transistor, MN1, of the second current mirror. Transistor MP5 constitutes a second output transistor of the first current mirror, and therefore duplicates on its drain the drain current of the input transistor MP3. Of course, the duplication of currents from one drain onto another is subject to a multiplication factor corresponding to the surface ratio of the concerned transistors (for example, if the surface ratio between transistors MP5 and MP3 is equal to 2, then the drain current of transistor MP5 is twice the drain current of transistor MP3).

FIG. 2 shows a feedback network of resistors P1 and R2. Resistor R1 is connected between voltage Vss and input E–, and resistor R2 is connected between the drain of transistor MP5 (output V) and input E–.

This amplifier operates as follows.

In quiescent state, it is assumed that voltages E– and E+ at terminals E– and E+ are equal. A same quiescent current in each branch, equal to E–/R1 (or E+/R1), is established, and the output voltage V is equal to (1+R2/R1)E–.

If voltage E+ becomes higher than voltage E–, the gate-source voltage of transistor MN1 increases. Transistor MN1 becomes more conductive, and the drain current of transistor MP3 increases. Current mirror MP3/MP4 causes the drain current of transistor MP4, and therefore the drain current of transistor MN2, to correspondingly increase. Current mirror MN1/MN2, causes the drain current of transistor MN1 to further increase, and so on.

This process does not diverge because the current mirror effect between transistors MP3 and MP5 duplicates the increase in current of transistor MP3 in transistor MP5. An increase in the current of transistor MP5 causes voltage V to increase, and therefore causes voltage E– to increase as well. Voltage E– increases until voltages E– and E+ are equal. At this point, a new current, E–/R1=E+/R1, is established in the three branches.

If voltage E+ becomes lower than voltage E–, the gate-source voltage of transistor MN1 decreases. Transistor MN1 becomes less conductive, and the drain current of transistor MP3 decreases. Due to the presence of the current mirror MP3/MP4, the drain current of transistor MP4, and therefore the drain current of transistor MN2, also decreases. Due to the presence of current mirror MN1/MN2, the drain current of transistor MN1 further decreases, and so on.

This process does not diverge because the above-described feedback effect operated by transistor MP5 acts to decrease voltage E– so as to make it tend to the new value of voltage E+.

The assembly of transistors MN1, MN2, MP3, and MP4, as described above, constitutes a feed-forward loop that is stabilized by a feedback loop.

Whatever be the value of voltage E+, the circuit of FIG. 2 acts so as to make voltage E– tend to voltage E+, and therefore to make the output voltage V tend to value (1+R2/R1)E+. The circuit behaves as an amplifier of gain (V/E+) equal to 1+R2/R1.

The amplifier according to the invention has the distinctive features of being self-biased (that is, it does not need any biasing stage) and of having a particularly small number of branches (three).

To improve the stability of the amplifier, a capacitor C1 (of approximately 25 pF, for example), can be connected between voltage Vdd and the gates of transistors MP3 and MP4.

Figure 1:
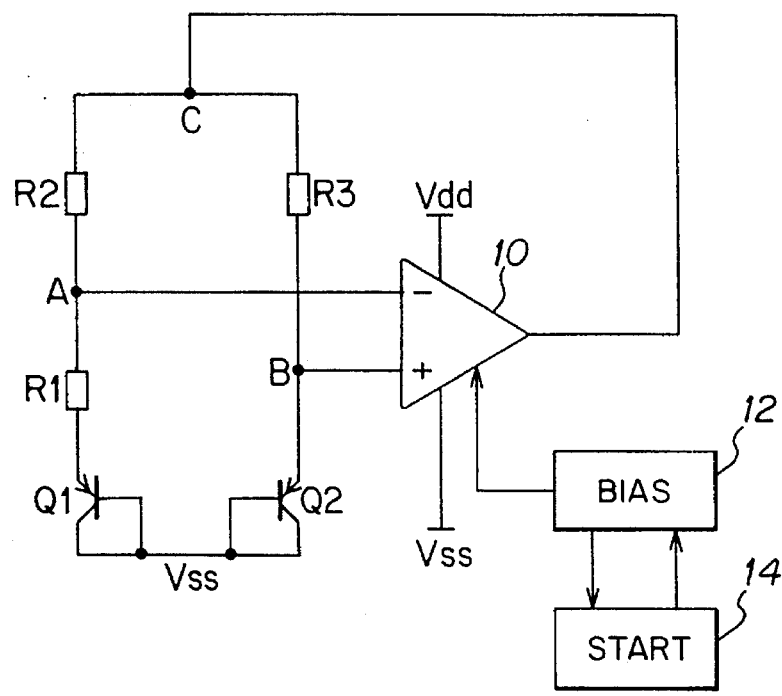
FIG. 1 above described, represents a conventional band-gap voltage generator.
Figure 3:
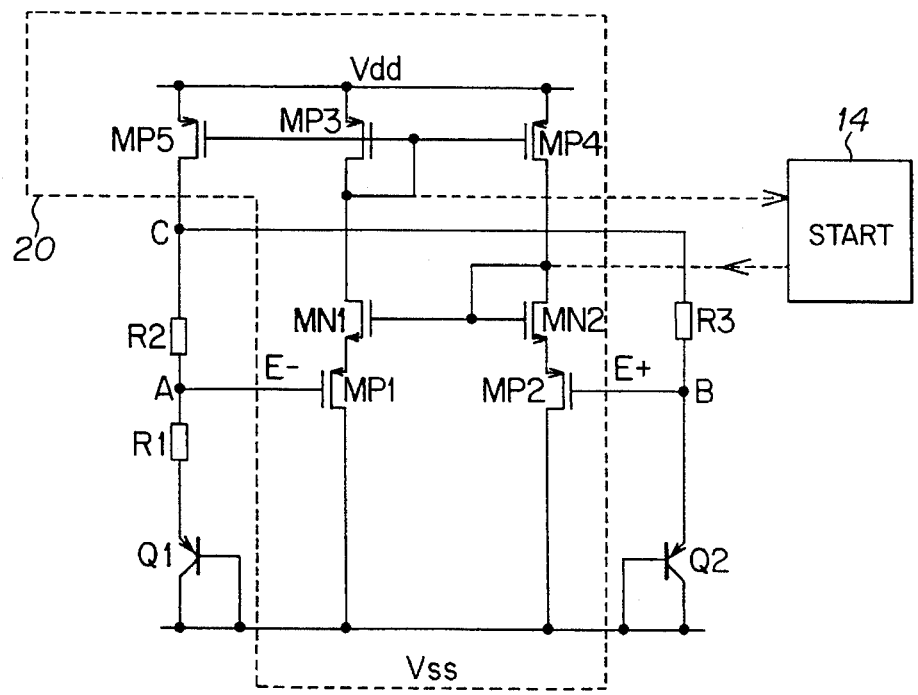
FIG. 3 represents the amplifier of FIG. 2 inserted in a band-gap voltage generator.

FIG. 3 represents a band-gap voltage generator according to the invention. Such a generator is obtained by replacing the amplifier 10 of FIG. 1 by the amplifier according to the invention, labeled 20. Nodes A and B (FIG. 1) are respectively connected to terminals E– and E+ of the amplifier according to the invention. The drain of the output transistor MP5 is connected to node C. A starting device 14 for measuring the current in transistors MP3 and MP4 is provided to inject a current at the input of current mirror MN1/MN2. Once the circuit of FIG. 3 reaches a non-zero current operating point, device 14 consumes only a residual current (an exemplary start device 14 is represented in FIG. 4, described hereinafter).

A CMOS band-gap voltage generator according to the invention has four power consuming branches only, i.e. the branches including respectively transistors Q1 and Q2, and the branches respectively including transistors MP1 and MP2 of the amplifier.

Figure 4:
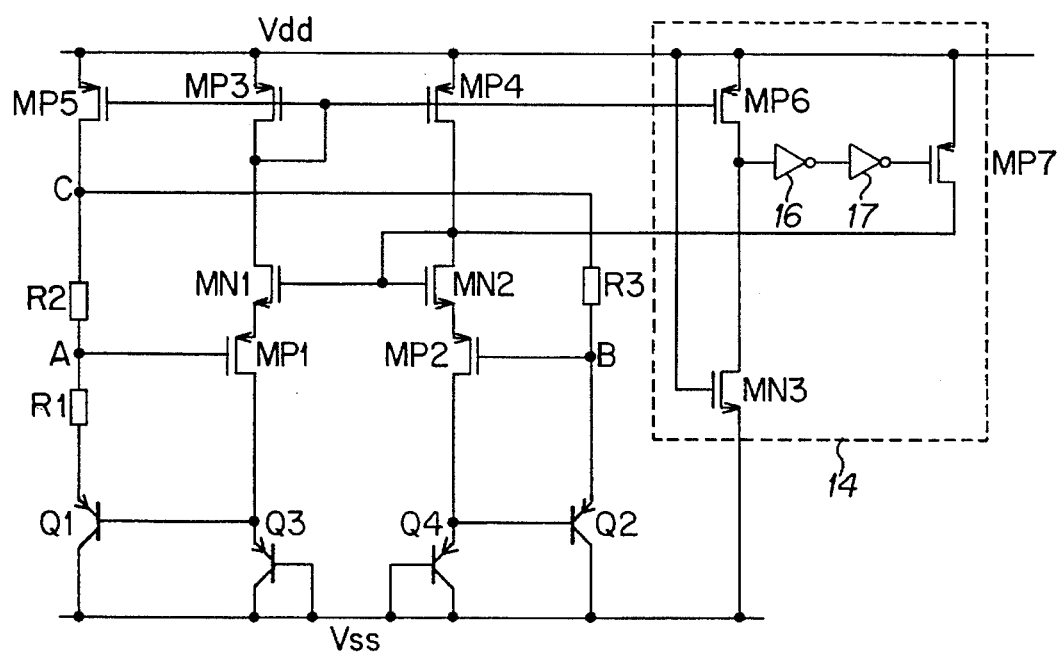
FIG. 4 represents a double band-gap voltage generator according to the invention.

FIG. 4 represents an embodiment of a double band-gap voltage generator using an amplifier according to the invention. Elements in FIG. 4 corresponding to those in FIG. 3 are designated with the same references as in FIG. 3. Transistors MP1 and MP2, instead of being directly connected to the low voltage Vss, are connected thereto through diode-connected PNP transistors Q3 and Q4. The bases of transistors Q1 and Q2, instead of being connected to the low voltage Vss, are respectively connected to the emitters of transistors Q3 and Q4.

Such a generator allows one to obtain twice the band-gap voltage between node C and Vss with only two additional bipolar transistors, whereas it is necessary with a conventional band-gap voltage circuit (as in FIG. 1) to practically double the number of components to double the band-gap voltage.

The advantage of producing a reference voltage twice as high, as in the generator of FIG. 4, is to decrease the influence of a parasitic offset voltage caused by the amplifier (due, for example, to an unsuitable matching of the amplifier transistors).

Many alternative approaches are known to decrease the effects of such offset voltage. For example, the roles of the transistors of branch MP3, MN1, and MP1 can be periodically exchanged with the roles of the respective transistors of branch MP4, MN2, and MP2 by using switches that are opened and closed at a high frequency. Such a circuit is referred to as a Chopper Stabilized Amplifier. This solution entirely eliminates the effects of the offset voltage.

FIG. 4 represents in more detail an exemplary starting device 14. Such a starting device includes a P-channel MOS transistor MP6 connected in parallel with the source and gate of transistor MP4. Transistor MP6 tends to duplicate on its drain the drain current of transistor MP4. The drain of transistor MP6 is connected to the low voltage Vss through an N-channel MOS transistor MN3 having its gate connected to the high voltage Vdd. Thus, transistor MN3 is constantly conductive. However, the channel width/length (W/L) ratio of transistor MN3 is selected to be very small, which causes transistor MN3 to behave as a very high value resistor. The node between transistors MP6 and MN3 is connected to the input of a buffer formed by two serially connected inverters 16 and 17. Inverter 17 controls the gate of a P-channel MOS transistor MP7 connected between the high voltage Vdd and the drain of transistor MN2.

If no current flows through transistor MP4 (or through transistor MP3), transistor MP6 is off. The input voltage of inverter 16 is pulled down to the low voltage Vss through transistor MN3. Transistor MP7 becomes conductive and injects a current in the drain of transistor MN2, which activates current mirror MN1/MN2. The current is established through the two amplifier branches and transistor MP6 becomes conductive. The input of inverter 16 is pulled up to the high voltage Vdd and transistor MP7 is off. A very low current is consumed in the branch including transistors MP6 and MN3, because transistor MN3 behaves as a high value resistor.

Exemplary W/L ratio values used for a generator consuming 50 μA with R2=R3=52500 Ω and R1=5320 Ω are typically:

| transistors | W/L |
| --- | --- |
| MP1, MP2, MN1, MN2 | 240 μm/6 μm |
| MP3, MP4 | 60 μm/12 μm |
| MP5 | 120 μm/12 μm |
| MN3 | 1.5 μm/56 μm |
| MP6 | 24 μm/1.2 μm |
| MP7 | 6 μm/1.2 μm. |

As is apparent to those skilled in the art, various modifications can be made to the above disclosed embodiments. In particular, a CMOS amplifier structure adapted to the fabrication of a CMOS reference voltage generator, including as few branches as possible, has been described. However, the invention predominantly relates to an amplifier structure that includes a small number of branches, and thus can be translated into bipolar technology.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereof.

What is claimed is:

1. A differential amplifier having an inverting input, a non-inverting input, and an output, and comprising, in series, between first and second supply voltages:

successively first, second, and third transistors of a first type, a second type, and the first type, respectively, the first transistor being an input transistor of a first current mirror, the second transistor being an output transistor of a second current mirror, a control electrode of the third transistor forming an inverting input of the amplifier, wherein a first circuit path connects the second and third transistors;

successively fourth, fifth, and sixth transistors of the first, the second, and the first type, respectively, the fourth transistor being an output transistor of the first current mirror, the fifth transistor being an input transistor of the second current mirror, a control electrode of the sixth transistor forming a non-inverting input of the amplifier, wherein a second circuit path connects the fifth and sixth transistors;

wherein an amplifier output current is provided by a seventh transistor of the first type that is an output transistor of the first current mirror; and wherein the first circuit path is substantially the same as the second circuit path.

2. The differential amplifier of claim 1, wherein the fourth, fifth, and sixth transistors are connected in series.

3. The differential amplifier of claim 2, wherein the first, second, and third transistors are connected in series, in the same fashion as the fourth, fifth, and sixth transistors.

4. The amplifier of claim 1, wherein the first type is P-channel MOS and the second type is N-channel MOS.

5. A circuit including an amplifier and a bandgap voltage generator that operates between first and second supply voltages, comprising:

successively first, second, and third transistors of a first type, a second type, and the first type, respectively, the first transistor being an input transistor of a first current mirror, the second transistor being an output transistor of a second current mirror, a control electrode of the third transistor forming an inverting input of the amplifier;

successively fourth, fifth, and sixth transistors of the first, the second, and the first type, respectively, the fourth transistor being an output transistor of the first current mirror, the fifth transistor being an input transistor of the second current mirror, a control electrode of the sixth transistor forming a non-inverting input of the amplifier;

wherein an amplifier output current is provided by a seventh transistor of the first type that is an output transistor of the first current mirror;

a first and a second bipolar transistor of different size connected to the second supply voltage, said bipolar transistors being connected to the amplifier output through two series-connected resistors and through a single resistor, respectively, a junction point between the two series-connected resistors being connected to the inverting input of the amplifier, and a junction point between the single resistor and the second bipolar transistor being connected to the non-inverting input of the amplifier.

6. The circuit of claim 5, including means for providing a current to the second current mirror if the first current mirror does not provide current.

7. The circuit of claim 5, wherein the third and sixth transistors of the amplifier are respectively connected to the bases of the first and second bipolar transistors and to the second voltage through, respectively, a third and a fourth diode-connected bipolar transistor.

8. The circuit of claim 7, including means for providing a current to the second current mirror if the first current mirror does not provide current.

9. A differential amplifier that operates between first and second supply voltages, the differential amplifier having an inverting input, a non-inverting input, and an output, and comprising:

three circuit branches disposed between the first and second supply voltages,
a first circuit branch having a first current and comprising an input device receiving the inverting input of the amplifier,
a second circuit branch having a second current and comprising an input device receiving the non-inverting input of the amplifier, and
a third circuit branch having a third current and comprising an output current of the amplifier at the output;
a first mirror circuit receiving as input the first current and generating as output the second current and the third current; and
a second mirror circuit, coupling the first and second circuit branches, receiving as input a voltage difference between a voltage at the non-inverting input and a voltage at the inverting input of the amplifier and generating as output the first current;
wherein a feedback network is connected between the output and the inverting input of the amplifier.

10. A differential amplifier that operates between first and second supply voltages, the differential amplifier having an inverting input, a non-inverting input, and an output, and comprising:

three circuit branches disposed between the first and second supply voltages,
a first circuit branch having a first current and comprising an input device receiving the inverting input of the amplifier,
a second circuit branch having a second current and comprising an input device receiving the non-inverting input of the amplifier, and
a third circuit branch having a third current and comprising an output current of the amplifier at the output;
a first current mirror receiving as input the first current and generating as output the second current and the third current; and
a second current mirror, coupling the first and second circuit branches, receiving as input a voltage difference between a voltage at the non-inverting input and a voltage at the inverting input of the amplifier and generating as output the first current;
wherein a feedback network is connected between the output and the inverting input of the amplifier, and the feedback network further couples to the second supply voltage.

11. The differential amplifier of claim 10, wherein the feedback network comprises a first impedance and a second impedance, the first impedance being disposed between the inverting input of the amplifier and the second supply voltage, and the second impedance being disposed between the inverting input of the amplifier and the output of the amplifier, the amplifier and the feedback network together comprising a closed loop amplifier having a closed loop gain, wherein a voltage at the output substantially equals the voltage at the non-inverting input times a sum of one plus a ratio of the second impedance to the first impedance.

12. The differential amplifier of claim 11, further comprising a compensation capacitor coupling the first current mirror to one of the first and second supply voltages.

13. The differential amplifier of claim 9, wherein the first mirror circuit comprises transistors of a first type, the second mirror circuit comprises transistors of a second type, and the input devices receiving the inverting and non-inverting inputs of the amplifier comprise transistors of the first type.

14. The differential amplifier of claim 13, wherein the first type of transistor is P-channel MOS and the second type is N-channel MOS.

15. A circuit including an amplifier and a bandgap voltage generator for operation between first and second supply voltages, the amplifier having an inverting input, a non-inverting input, and an output, the circuit comprising:

three circuit branches disposed between the first and second supply voltages,
a first circuit branch having a first current and comprising an input device receiving the inverting input of the amplifier,
a second circuit branch having a second current and comprising an input device receiving the non-inverting input of the amplifier, and
a third circuit branch having a third current and comprising an output current of the amplifier at the output;
a first current mirror receiving as input the first current and generating as output the second current and the third current;
a second current mirror, coupling the first and second circuit branches, receiving as input a voltage difference between a voltage at the non-inverting input and a voltage at the inverting input of the amplifier and generating as output the first current;
a first diode-connected bipolar transistor having a first diode drop and being disposed between the second supply voltage and the non-inverting input of the amplifier;
a first impedance and a second diode-connected bipolar transistor having a second diode drop connected in series between the second supply voltage and the inverting input of the amplifier;
the first diode-connected bipolar transistor having an emitter surface that is smaller than an emitter surface of the second bipolar transistor; and
a third impedance disposed between the non-inverting input and the output of the amplifier;
wherein the first current mirror comprises transistors of a first type, the second current mirror comprises transistors of a second type, and the input devices receiving the inverting and non-inverting inputs of the amplifier comprise transistors of the first type.

16. The circuit of claim 15, comprising:
a third diode-connected bipolar transistor having a third diode drop and being disposed within the first circuit branch, the third diode drop being substantially in series with the second diode drop; and
a fourth diode-connected bipolar transistor having a fourth diode drop, and being disposed within the second circuit branch, the fourth diode drop being substantially in series with the first diode drop.

17. The circuit of claim 16, wherein the first, second, third, and fourth bipolar transistors are all of a one type.

18. The circuit of claim 17, wherein the one type is PNP.

19. The circuit of claim 15, further comprising a start circuit that senses a test current in the amplifier and actuates a change that starts a flow of current in the amplifier if the test current substantially equals zero.

20. The circuit of claim 19, wherein the test current flows in the first current mirror and the change comprises injecting a force current into the second circuit branch.

21. The circuit of claim 20, wherein the start circuit comprises, in series:

a first start transistor of the first type generating a fourth current in response to the test current; and a second start transistor of the second type, that is always biased on, having a high resistance value;

a third start transistor of the first type, controlled by a voltage formed at a junction point between the first and second start transistors, for supplying the force current if the fourth current is substantially zero, and for supplying substantially zero current to the second circuit branch if the fourth current is substantially non-zero.

22. A differential amplifier, comprising:

non-inverting input means for providing a first current in a first circuit branch of the amplifier in response to a first input voltage at a first terminal of the amplifier;

inverting input means for providing a second current in a second circuit branch of the amplifier in response to a second input voltage at a second terminal of the amplifier;

means for replicating the second current to generate the first current in the first circuit branch and a third current in a third circuit branch, the third current comprising an output current of the amplifier;

means for sensing a difference voltage between the first input voltage and the second input voltage, and for modulating the second current in the second circuit branch and the output current in response to the difference voltage; and means for generating feedback to the inverting input means in response to the output current of the amplifier.

23. The amplifier of claim 22, further comprising compensation means for stabilizing the closed loop amplifier.

24. A circuit including an amplifier and a bandgap voltage generator, comprising:

non-inverting input means for providing a first current in a first circuit branch of the amplifier in response to a first input voltage at a first terminal of the amplifier;

inverting input means for providing a second current in a second circuit branch of the amplifier in response to a second input voltage at a second terminal of the amplifier;

means for replicating the second current to generate the first current in the first branch, and for generating a third current in a third circuit branch, the third current comprising an output current of the amplifier;

means for sensing a difference voltage between the first input voltage and the second input voltage, and for modulating the second current in the second circuit branch in response to the difference voltage;

means for generating a first and a second diode means that provide first and second diode voltages, respectively, wherein the first diode voltage is greater than the second diode voltage;

means for coupling the first diode voltage to the non-inverting input means;

means for coupling the second diode voltage to the inverting input means;

means for generating a difference signal associated with a difference between the first and second diode voltages, and for applying the difference signal to the inverting input means so that the second input voltage at the inverting input means substantially equals a sum of the second diode voltage and the difference signal; and feedback means for coupling the output voltage to the inverting input means, so that the output voltage is proportional to the first diode voltage.

25. The circuit of claim 24, further comprising third and fourth diode means for providing third and fourth diode voltages, respectively, wherein a forward bias for the third and fourth diode means is provided by the first and second currents, respectively, and wherein the third and fourth diode voltages are substantially in series with the first and second diode voltages, respectively.

26. The circuit of claim 24, further comprising a starting means for starting the circuit, comprising:

means for sensing a test current in the amplifier;

means for determining whether the test current substantially equals zero;

means for injecting a force current into the amplifier, if the test current substantially equals zero, to induce a flow of quiescent current in one of the first, second, and third circuit branches.

27. A method for amplifying an input voltage to produce a regulated output voltage, both referenced to a common supply voltage, using an amplifier having a non-inverting input voltage that couples to a first circuit branch, having an inverting input voltage that couples to a second circuit branch, and having an output circuit branch that provides an output current at an output node, the amplifier performing the steps of:

establishing a quiescent current in the second current branch;

modulating the quiescent current in the second circuit branch in response to a difference between the applied input voltage and the inverting input voltage;

replicating the modulated current in the second circuit branch to generate a modulated current in the first circuit branch and a modulated output current in the output circuit branch;

converting the modulated output current into the regulated output voltage by applying a load disposed between the output node and the common supply voltage, the load comprising successively second and first impedances;

conveying a voltage formed at a junction between the second and first impedances to the inverting input voltage; and correcting a difference between the inverting input voltage and the non-inverting input voltage by performing the steps of modulating, replicating, converting, and conveying so as to generate a regulated output voltage having a value substantially proportional to the non-inverting input voltage.

28. A method for amplifying an input voltage to produce a regulated output voltage, both referenced to a common voltage, using an amplifier having a non-inverting input voltage that couples to a first circuit branch, having an inverting input voltage that couples to a second circuit branch, and having an output circuit branch that provides an output current at an output node, the amplifier performing the steps of:

establishing a quiescent current in the second current branch;

modulating the quiescent current in the second circuit branch in response to a difference between the applied input voltage and the inverting input voltage;

replicating the modulated current in the second circuit branch to generate a modulated current in the first circuit branch and a modulated output current in the output circuit branch;

converting the modulated output current into the output voltage by applying a load disposed between the output node and the common voltage, the load comprising successively second and first impedances;

conveying a voltage formed at a junction between the second and first impedances to the inverting input voltage; and correcting a difference between the inverting input voltage and the non-inverting input voltage by performing the steps of modulating, replicating, converting, and conveying so as to generate a regulated output voltage having a value substantially proportional to the non-inverting input voltage;

wherein the regulated output voltage has a value substantially equal to the non-inverting input voltage times a sum of one plus a ratio of the second impedance to the first impedance.

29. A differential amplifier having an inverting input, a non-inverting input, and an output, and comprising, in series, between first and second supply voltages:

successively first, second, and third transistors of a first type, a second type, and the first type, respectively, the first transistor being an input transistor of a first mirror circuit, the second transistor being an output transistor of a second mirror circuit, a control electrode of the third transistor forming an inverting input of the amplifier;

successively fourth, fifth, and sixth transistors of the first, the second, and the first type, respectively, the fourth transistor being an output transistor of the first mirror circuit, the fifth transistor being an input transistor of the second mirror circuit, a control electrode of the sixth transistor forming a non-inverting input of the amplifier;

wherein an amplifier output current is provided by a seventh transistor of the first type that is an output transistor of the first mirror circuit; and wherein the inverting and non-inverting inputs each have a voltage, and the amplifier output current couples to the inverting input of the amplifier so that the voltage at the inverting input tends toward the voltage at the non-inverting input of the amplifier.

30. A differential amplifier having an inverting input, a non-inverting input, and an output, and comprising, in series, between first and second supply voltages:

successively first, second, and third transistors of a first type, a second type, and the first type, respectively, the first transistor being an input transistor of a first current mirror, the second transistor being an output transistor of a second current mirror, a control electrode of the third transistor forming an inverting input of the amplifier;

successively fourth, fifth, and sixth transistors of the first, the second, and the first type, respectively, the fourth transistor being an output transistor of the first current mirror, the fifth transistor being an input transistor of the second current mirror, a control electrode of the sixth transistor forming a non-inverting input of the amplifier;

wherein an amplifier output current is provided by a seventh transistor of the first type that is an output transistor of the first current mirror; and wherein the inverting and non-inverting inputs each have a voltage, and the amplifier output current couples to the inverting input of the amplifier so that the voltage at the inverting input tends toward the voltage at the non-inverting input of the amplifier, and wherein the differential amplifier further comprises load impedances.

31. The differential amplifier of claim 30, wherein a magnitude of the load impedances determines the quiescent current of the differential amplifier.

32. A differential amplifier having an inverting input, a non-inverting input, and an output delivering an output current, and comprising, in series, between first and second supply voltages:

successively first, second, and third transistors of a first type, a second type, and the first type, respectively, the first transistor being an input transistor of a first mirror circuit, the second transistor being an output transistor of a second mirror circuit, a control electrode of the third transistor forming an inverting input of the amplifier;

successively fourth, fifth, and sixth transistors of the first, the second, and the first type, respectively, the fourth transistor being an output transistor of the first mirror circuit, the fifth transistor being an input transistor of the second mirror circuit, a control electrode of the sixth transistor forming a non-inverting input of the amplifier; and wherein the output current is coupled to an output impedance, the output impedance determining the quiescent current of the differential amplifier.

33. The differential amplifier of claim 32, wherein the amplifier output current is provided by a seventh transistor of the first type that is an output transistor of the first current mirror.

34. The differential amplifier of claim 32, wherein the output impedance couples to the non-inverting input to generate feedback.

35. The differential amplifier of claim 33, wherein the output impedance couples to the non-inverting input to generate feedback.

* * * * *

UNITED STATES PATENT AND TRADEMARK OFFICE
CERTIFICATE OF CORRECTION

PATENT NO. : 5,483,196

DATED : January 9, 1996

INVENTOR(S): Serge RAMET

It is certified that error appears in the above-identified patent and that said Letters Patent is hereby corrected as shown below:

On title page, item [73] should read as follows:
[73] Assignee: SGS-Thomson Microelectronics, S.A.
Saint Genis, Pouilly, France Signed and Sealed this Twenty-sixth Day of March, 1996

Attest:

BRUCE LEHMAN

Attesting Officer      Commissioner of Patents and Trademarks